United States Patent [19]

Aihara et al.

[11] 4,015,146
[45] Mar. 29, 1977

[54] NEGATIVE RESISTANCE NETWORK

[75] Inventors: Mitsuo Aihara, Tokyo; Shigeho Takada, Ooita; Hisaharu Ogawa, Yokohama, all of Japan

[73] Assignee: Tokyo Shibaura Electric Co., Ltd., Kawasaki, Japan

[22] Filed: Dec. 16, 1975

[21] Appl. No.: 641,385

[30] Foreign Application Priority Data

Dec. 16, 1974 Japan ............................ 49-144874

[52] U.S. Cl. .............................. 307/304; 307/251; 307/322
[51] Int. Cl.[2] ......................................... H03K 3/53
[58] Field of Search .......... 307/205, 251, 304, 279, 307/303, 322; 333/80 T

[56] References Cited
UNITED STATES PATENTS

| | | | |
|---|---|---|---|
| 3,255,364 | 6/1966 | Warner, Jr. | 333/80 T |
| 3,670,184 | 6/1972 | Idei et al. | 307/304 |
| 3,840,829 | 10/1974 | Fletcher et al. | 333/80 T |

*Primary Examiner*—Stanley D. Miller, Jr.
*Assistant Examiner*—B. P. Davis
*Attorney, Agent, or Firm*—Oblon, Fisher, Spivak, McClelland & Maier

[57] ABSTRACT

This negative resistance network includes a first predetermined channel insulated gate enhancement type field effect transistor having a drain-source path connected to positive and negative input terminals on which a predetermined input voltage is impressed. The gate potential of the first field effect transistor is controlled by a second insulated gate enhancement type field effect transistor having an opposite channel type to the first field effect transistor, a gate connected to the drain thereof which is connected to the predetermined one of the positive and negative input terminals and a source connected to one pole of a dc power supply having a predetermined voltage, and by a third insulated gate enhancement type field effect transistor having the same channel type as the first field effect transistor, a drain and a gate connected to the drain of the second field effect transistor as well as to the gate of the first field effect transistor and a source connected to the source thereof which is connected to the other input terminal as well as to the other pole of the dc power supply, whereby the first field effect transistor shows a negative resistance characteristic attaining a relatively low current consumption over a relatively wide level range of the input voltage.

4 Claims, 11 Drawing Figures

NEGATIVE RESISTANCE NETWORK

BACKGROUND OF THE INVENTION

The present invention relates to a negative resistance network, and more particularly to a novel type negative resistance network utilizing a plurality of insulated gate enhancement type field effect transistors (hereinafter referred to as IGFET's).

The prior art negative impedance network includes the type utilizing a screen-grid (or tetrode) tube or a zener diode. However, the prior art negative resistance network consumes a relatively large amount of current and indicates a negative resistance characteristic over only a relatively narrow level range of an input voltage.

SUMMARY OF THE INVENTION

It is, therefore, the object of the present invention to provide a negative resistance network which shows a negative resistance characteristic attaining a lower current consumption over a wider level range of an input voltage than any conventional negative resistance network.

According to the preferred embodiment of this invention, there is provided a negative resistance network characterized by comprising a first predetermined channel IGFET having a drain-source path connected to positive and negative input terminals to which a predetermined input voltage is applied; a second IGFET having an opposite channel type to the first IGFET, a gate connected to the drain thereof which is connected to a predetermined one of the positive and negative input terminals, and a source connected to one pole of a dc power supply having a predetermined voltage; and a third IGFET having the same channel type as the first IGFET, a drain and a gate connected to the drain of the second IGFET as well as to the gate of the first IGFET, and a source connected to the source thereof which is connected to the other input terminal as well as to the other pole of the dc power supply.

The negative resistance network constructed utilizing the aforesaid first to third IGFET's has the advantage of indicating a negative resistance characteristic attaining a relatively low current consumption over a wider level range of an input voltage than any prior art negative resistance network.

According to another development of the invention, a dc impedance element is connected between the source of the third IGFET and the one pole of the dc power supply. The negative resistance network thus constructed has the advantage, in addition to that of the preferred embodiment, of optionally controlling the characteristic of an input voltage applied to the input terminals relative to an input current flowing from the input terminals into the subject network to choosing the resistance value of the impedance element.

According to a further development of the invention, a dc impedance element is connected between the drain of the first IGFET and the one input terminal. The negative resistance network so constituted has the advantage, in addition to that of the preferred embodiment, of appropriately controlling the amount of an input current flowing from the input terminals into the subject network by selecting the resistance value of the impedance element.

According to a still another development of the invention, a dc impedance element is connected in parallel with the drain-source path of the first IGFET or the input terminals. The negative impedance network thus constructed can provide the so-called two-stable type negative resistance network.

DETAILED DESCRIPTION OF THE PREFERRED EMBODIMENTS

Preferred embodiments of a negative resistance network in accordance with the invention will now be described by reference to the appended drawings.

Figure 1:
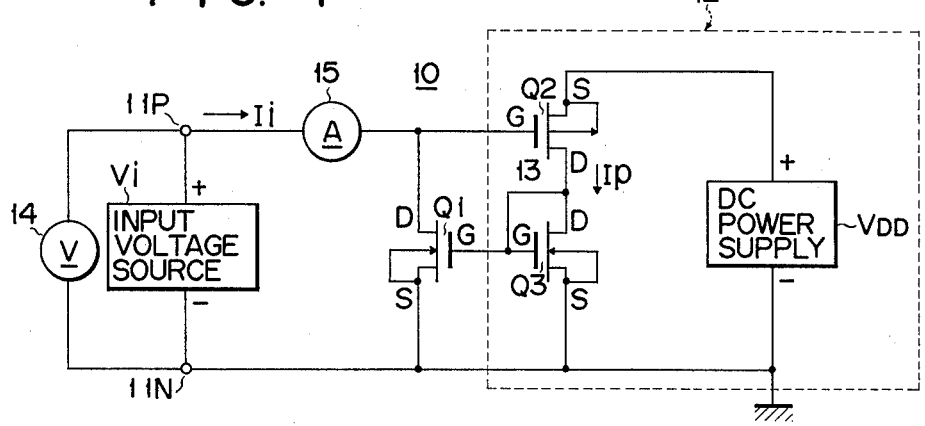
FIG. 1 is a schematic circuit diagram of a negative resistance network according to one embodiment of the invention.

FIG. 1 is a schematic circuit diagram according to one embodiment of the invention. In FIG. 1, reference symbol V*i* denotes an input dc voltage source (permissibly an input ac voltage source on which a dc bias voltage of an appropriate value is superimposed).

One input terminal 11P connected to the positive pole of the input voltage source V*i* is connected with the drain of, e.g. an N-channel IGFET Q1 (or the source of a P-channel IGFET). The IGFET Q1 has a substrate electrode and a source connected to the other input terminal 11N which is connected to the grounded negative pole of the input voltage source V*i*. The aforesaid one input terminal 11P is also connected to the gate of an opposite channel IGFET to the IGFET Q1, i.e, a P-channel IGFET Q2 in this embodiment. The IGFET Q2 has a substrate electrode and a source connected to the positive pole of a dc power supply $V_{DD}$ having an appropriate value (10 volts or 15 volts in this embodiment).

The drain of the P-channel IGFET Q2 is connected to the drain and the gate of an opposite channel IGFET to the IGFET Q2, i.e, the same N-channel IGFET Q3 as the IGFET Q1 in this embodiment as well as to the gate thereof. The IGFET Q3 has a substrate electrode and a source connected to the grounded negative pole of the dc power supply $V_{DD}$.

The operation of a circuitry 10 shown in FIG. 1 will now be described with reference to FIG. 2.

It should be noted that, as an IGFET usually has a gate insulation layer and in consequence a substantially infinite input impedance, drain current flowing through the drain-source path of the IGFET Q1 only consists of current Ii supplied from the input voltage source Vi, and that current flowing through the series connected drain-source paths of the IGFET's Q2 and Q3 is only formed of current $I_P$ supplied from the dc power supply $V_{DD}$.

Thus, an amount of the current $I_P$ flowing from the dc power supply $V_{DD}$ into the series connected drain-source paths of the IGFET's Q2 and Q3, i.e. the internal impedances thereof gradually vary as the voltage supplied from the input voltage source Vi to the positive input terminal 11P, i.e. the drain potential of the IGFET Q1 and in consequence the gate potential of the IGFET Q2 increases from zero volt. As a result, the gate potential of the IGFET Q1 is so controlled that an amount of the input current Ii flowing from the input voltage source Vi into the circuitry 10 of FIG. 1, i.e. an amount of the drain current flowing through the drain-source path of the IGFET Q1 in this embodiment varies along curves 21 ($V_{DD} = 10$ volts) and 22 ($V_{DD} = 15$ volts) shown in FIG. 2 with the increment of the voltage impressed from the input voltage source Vi on the positive input terminal 11P. Consequently, a circuit portion 12 of FIG. 1 including the dc power supply $V_{DD}$ and the IGFET's Q2 and Q3 acts as a control circuit for controlling a gate bias voltage being applied to the gate of the IGFET Q1 in response to the variation of voltage level supplied from the input voltage source Vi to the positive input terminal 11P.

A line 13 connecting the drain and gate of the IGFET Q3 functions as a positive feedback line only during the period in which the IGFET Q2 is rendered conductive, i.e. voltage supplied from the input voltage source Vi to the gate of the IGFET Q2 is higher than substantially the gate threshold voltage Vth thereof, said line 13 acts as a negative feedback line during the period in which the gate potential of the IGFET Q2 is lower than almost the gate threshold voltage Vth thereof and in consequence the IGFET Q2 is made substantially nonconductive. The negative resistance operation of the circuitry 10 of FIG. 1 will now be described by the equation (3) given later.

Designating the conductance of the IGFET Q2 as Gmp and voltage applied between the gate and the source thereof as $V_{GS}$, the current $I_P$ flowing through the series-connected drain-source paths of the IGFET's Q2 and Q3 will be expressed by the following equation.

$$I_P = Gmp \cdot V_{GS} \qquad (1)$$

$V_{GS}$ in the above equation (1) is equal to ($V_{DD} - Vi$) as apparent from the circuitry 10 of FIG. 1 and in consequence the above equation (1) can be rewritten.

$$I_P = Gmp(V_{DD} - Vi) \qquad (2)$$

Where the IGFET Q1 exhibits the same operation characteristic as the IGFET Q3, then the current Ii flowing from the input voltage source Vi into the drain-source path of the IGFET Q1 is substantially equal to the above-mentioned current $I_P$. Consequently, $$Ii \approx Gmp \cdot V_{DD} - Gmp \cdot Vi \qquad (3)$$

The second term of the right side of the equation (3) shows a negative resistance characteristic.

Figure 2:
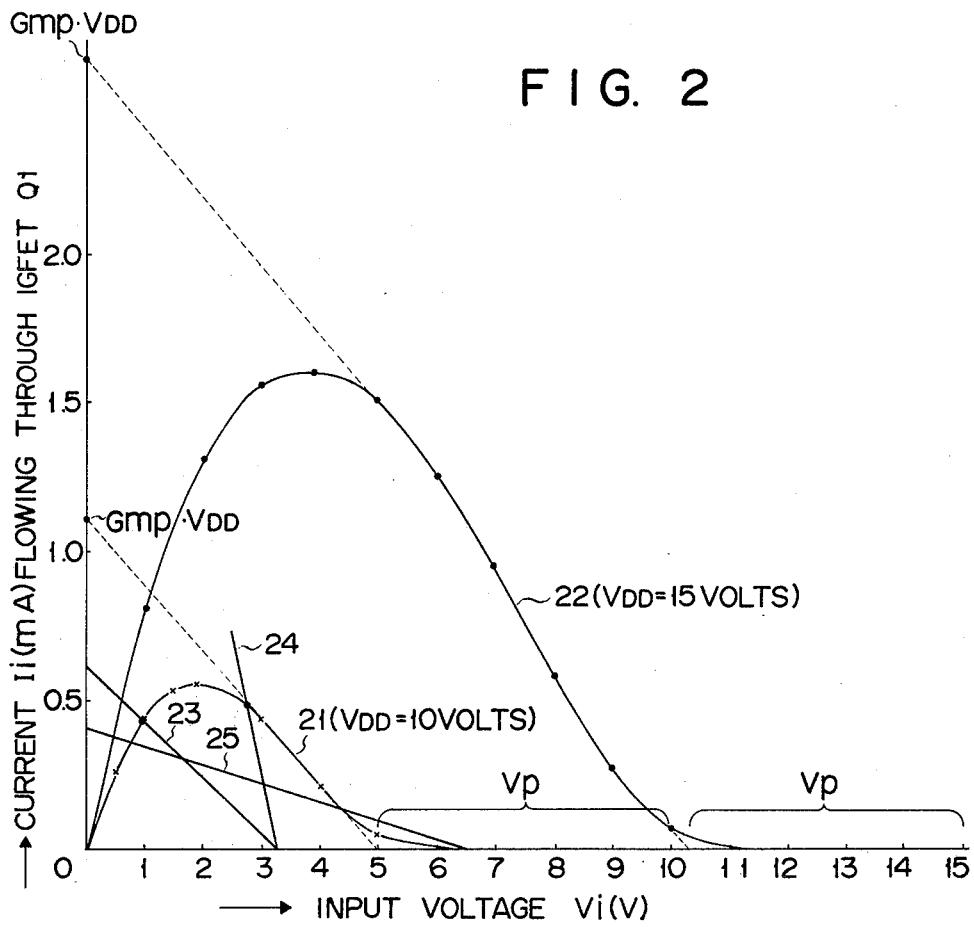
FIG. 2 shows curve diagrams illustrating the relationship between the input voltage V*i* versus the input current I*i* of the circuitry shown in FIG. 1.

$V_P$ shown in FIG. 2 is the pinch-off voltage of the IGFET Q2. The respective plotted points on the curves 21 and 22 each show variations measured by an ampere meter 15 in the amount of current Ii flowing from the input voltage source Vi into the circuitry 10 of FIG. 1, while reading increments from zero volt in the voltage of the input voltage source Vi on a voltmeter 14 with the voltmeter 14 connected between the positive and negative input terminals 11P and 11N, and the ampere meter 15 connected between the nongrounded side positive input terminal 11P and the drain of the IGFET Q1.

Thus, the operation characteristic of the circuitry 10 of FIG. 1 shown by the curves 21 and 22 of FIG. 2 is determined by those of the IGFET's Q1 to Q3 including the respective gate threshold voltage Vth thereof. More particularly, the present inventors' experiments prove that the circuitry 10 of FIG. 1 shows a positive resistance characteristic only during the period in which the gate potential of the IGFET Q1 is higher than substantially the gate threshold voltage Vth thereof, but indicates a negative resistance characteristic attaining a lower current consumption over a wider level range of an input voltage applied from the input voltage source Vi than any conventional negative resistance network, while the gate potntial of the IGFET Q1 is lower than the gate threshold voltage Vth thereof.

Therefore, it will be apparent to those skilled in the art that the circuitry 10 of FIG. 1 can carry out, by the selection of the operation point thereof, a monostable operation (see load line 23 of FIG. 2), an astable operation (see load line 24 of FIG. 2) or the monostable-astable operation (see load line 25 of FIG. 2) as in the conventional negative resistance network.

Figure 3:
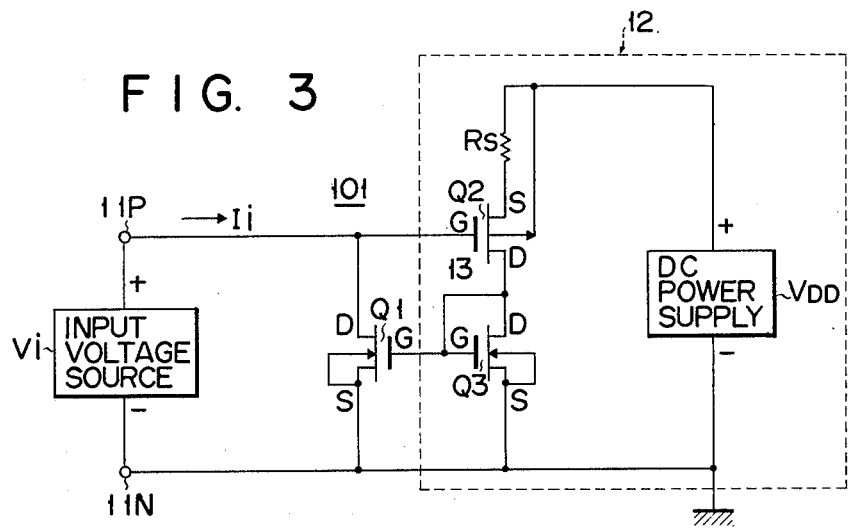
FIG. 3 is a schematic circuit diagram of a negative resistance network according to another embodiment of the invention.

FIG. 3 is a schematic circuit diagram of a negative resistance network according to another embodiment of the invention. The circuitry 101 of FIG. 3 has the same construction as that of FIG. 1, excepting that a dc impedance element, e.g. a resistor $R_S$ is connected between the source of the P-channel IGFET Q2 and the nongrounded side positive pole of the dc power supply $V_{DD}$. Consequently, parts of FIG. 3 corresponding to those of FIG. 1 are denoted by the same symbols and the description thereof is omitted.

Figure 4:
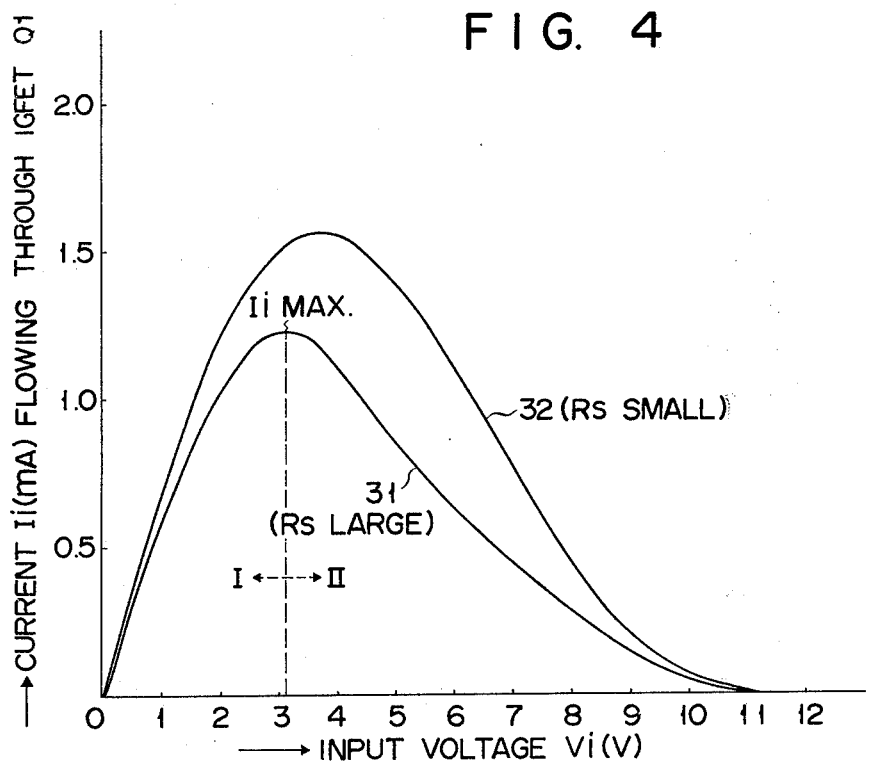
FIG. 4 shows curve diagrams illustrating the relationship between the input voltage V*i* versus the input current I*i* of the circuitry of FIG. 3.

The circuitry 101 of FIG. 3 constructed as above-mentioned can be so controlling as clear from curves 31 and 32 shown in FIG. 4, that the larger the value of the resistor $R_S$, the smaller the maximum current Ii max present at the boundary between the positive resistance operation region I of the circuitry 101 of FIG. 3 and the negative resistance operation region II thereof, and also the smaller the slopes of the curves 31 and 32 in the positive and negative resistance regions I and II.

Figure 5:
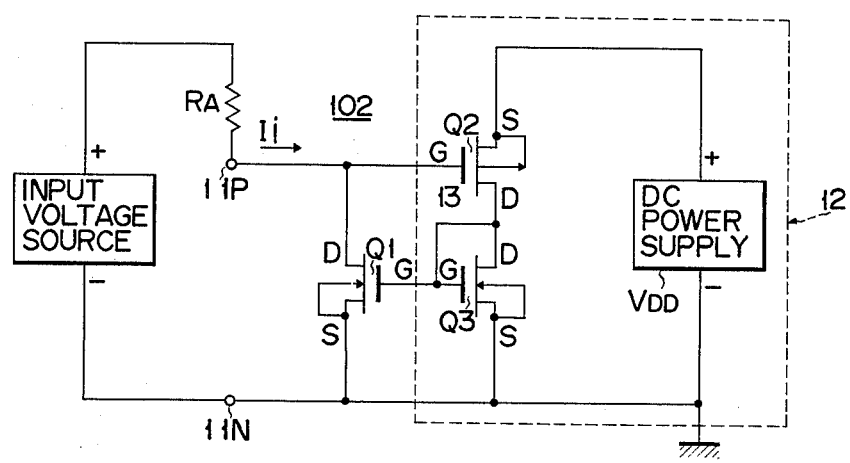
FIGS. 5 and 6 are schematic circuit diagrams of negative resistance networks according to different embodiments of the invention.

FIG. 5 is a schematic circuit diagram of a negative resistance network according to a further embodiment of the invention.

The circuitry 102 of FIG. 5 has the same construction as that of FIG. 1, excepting that a dc impedance element, e.g. a resistor $R_A$ is connected between the drain of the N-channel IGFET Q1 and the nongrounded side positive input terminal 11P. Consequently, parts of FIG. 5 corresponding to those of FIG. 1 are designated by the same symbols and the description thereof is omitted.

With the circuitry 102 of FIG. 5 of the above-mentioned construction, it will be apparent that the larger the value of the resistor $R_A$, the smaller the amount of current Ii flowing through the drain-source path of the IGFET Q1 in response to the voltage level of the input voltage source $Vi$.

Figure 6:
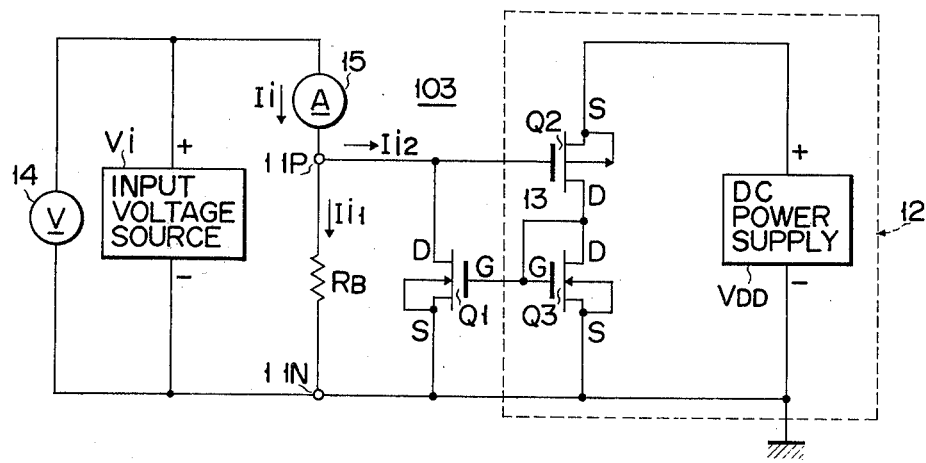

FIG. 6 is a schematic circuit diagram of a negative resistance network according to a still another embodiment of the invention. The circuitry 103 of FIG. 6 has the same construction as that of FIG. 1, excepting that a dc impedance element, e.g. a resistor $R_B$ is so connected between the positive and negative input terminals 11P and 11N as to be disposed in parallel with the drain-source path of the IGFET Q1 as well as the input voltage source $Vi$. Parts of FIG. 5 corresponding to those of FIG. 1 are indicated by the same symbols and the description thereof is omitted.

Figure 7:
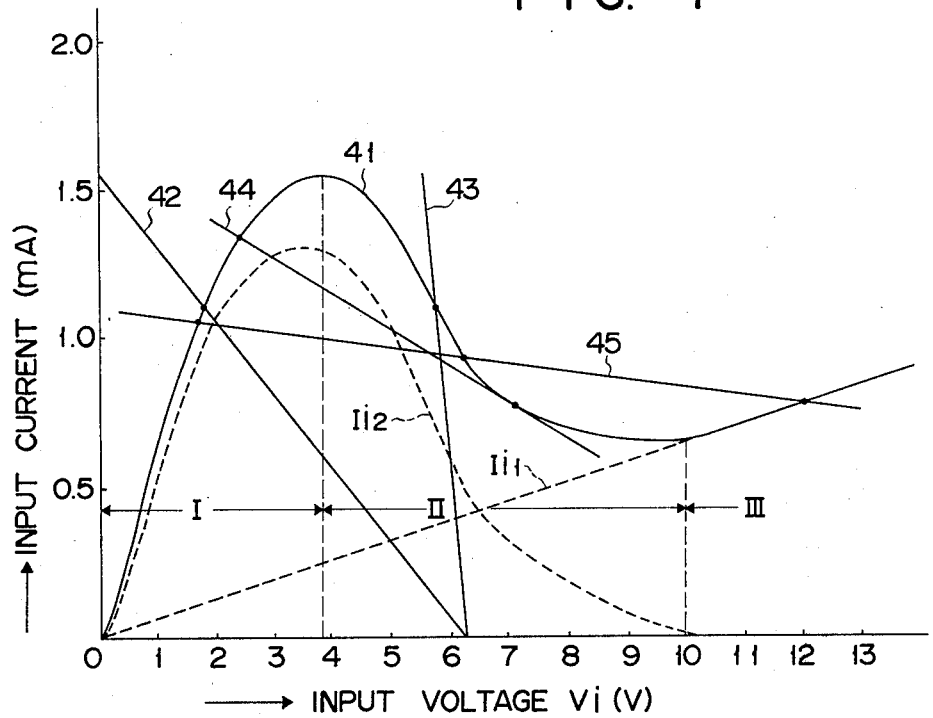
FIG. 7 is a curve diagram illustrating the relationship between the input voltage V*i* versus the input current I*i* of the circuitry of FIG. 6.

With the circuitry 103 of FIG. 6 constructed as above-mentioned, current $Ii$ flowing thereinto from the input voltage source $Vi$ is divided into current $Ii1$ flowing through the resistor $R_B$ and current $Ii2$ flowing through the drain-source path of the IGFET Q1. In addition to a positive resistance operation region I and a negative resistance operation region II as in the circuitries of FIGS. 1, 3 and 5, therefore, the circuitry 103 of FIG. 6 has another positive resistance operation region III resulting from the composition of the aforesaid $Ii1$ and $Ii2$. Obviously, the circuitry 103 of FIG. 6 can carry out, by the selection of the operation point thereof, a two stable operation (see load line 45 of FIG. 7), in addition to a monostable operation (see load line 42 of FIG. 7), an astable opeation (see load line 43 of FIG. 7) or a monostable-astable operation (see load line 44 of FIG. 7) as in the circuitries of FIGS. 1, 3 and 5.

Figure 8:
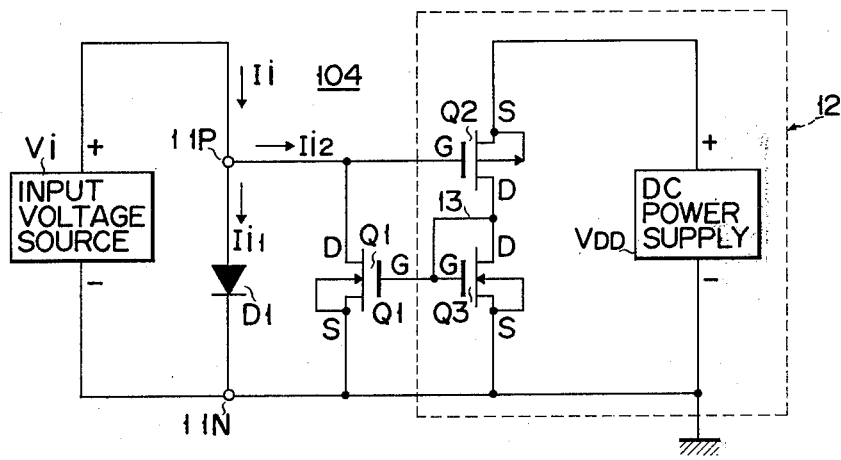
FIG. 8 is a schematic circuit diagram showing one modification of the circuitry of FIG. 6.

FIG. 8 is a schematic circuit diagram of one modification of FIG. 6. The negative resistance network 104 of FIG. 8 has the same construction as that of FIG. 6, excepting that the resistor $R_B$ of FIG. 6 is replaced by a diode D1. Parts of FIG. 8 corresponding to those of FIG. 6 are designated by the same symbols and the description is omitted.

Figure 9:
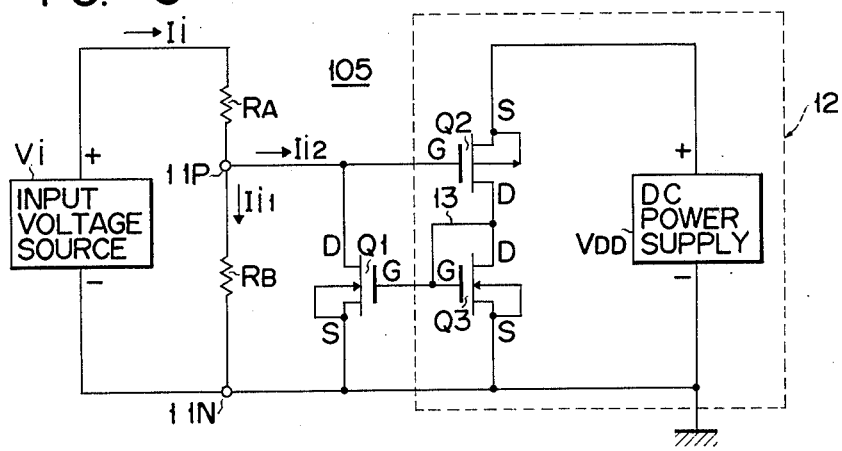
FIG. 9 shows the combination of the circuitries of FIGS. 5 and 6.
Figure 10:
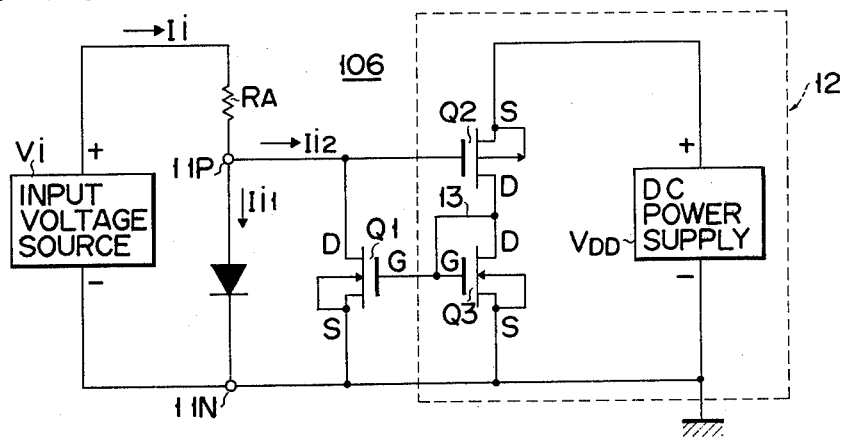
FIG. 10 shows the combination of the circuitries of FIGS. 5 and 8.
Figure 11:
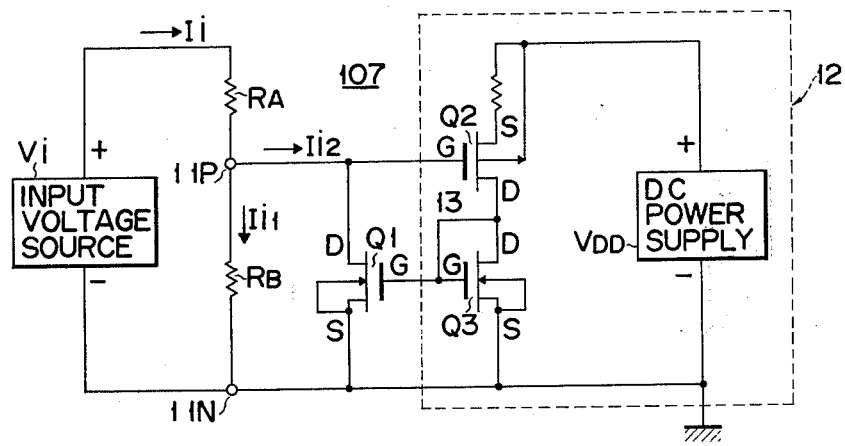
FIG. 11 shows the combination of the circuitries of FIGS. 3 and 9.

It should be understood that the foregoing embodiments are merely exemplary of the preferred practices of the invention and that various changes, modifications and variations may be made in the arrangements, operations and details of construction of the elements disclosed herein, without departing from the spirit and the scope of the invention. For example, a negative resistance network suitable for various applications can be constituted by the appropriate combination of the circuitries of FIGS. 1, 3, 5 and 6 (or 8). Thus, FIG. 9 or 10 shows the combination 106 or 107 of the circuitry 102 of FIG. 5 and the circuitry 103 or 104 of FIG. 6 or 8. FIG. 11 indicates the combination 108 of the circuitry 101 of FIG. 3 and the circuitry 105 of FIG. 9.

Further, the aforesaid embodiments refer to the case where the IGFET's Q1 and Q3 were of N-channel type and the IGFET Q2 of P-channel type. But the former IGFET's Q1 and Q3 may be of P-channel type and the latter IGFET Q2 of N-channel type. In this case, the input voltage source $Vi$ and the dc power supply $V_{DD}$ are only required to have their polarities reversed from those shown in the embodiments in order to attain their correct circuit connection.

What we claim is:

1. A negative resistance network having positive and negative input terminals to which a predetermined input voltage is applied comprising a first predetermined channel insulated gate enhancement field effect transistor with a drain-source path connected across the positive and negative input terminals;

a second insulated gate enhancement type field effect transistor of an opposite channel type to the first field effect transistor, the gate of the second field effect transistor being connected to the drain of the first field effect transistor and to a predetermined one of the positive and negative input terminals, and the source of the second field effect transistor being connected to one pole of a dc power supply having a predetermined voltage; and a third insulated gate enhancement type field effect transistor of the same channel type as the first field effect transistor, the drain and the gate of the third field effect transistor being connected to the drain of the second field effect transistor and to the gate of the first field effect transistor, and the source of the third field effect transistor being connected to the source of the first field effect transistor, to the other input terminal and to the other pole of the dc power supply.

2. A negative resistance network as in claim 1 wherein a dc impedance element is connected between the source of the second field effect transistor and the one pole of the dc power supply.

3. A negative resistance network as in claim 1 wherein a dc impedance element is connected between the one input terminal and the drain of the first field effect transistor.

4. A negative resistance network as in claim 1 wherein a dc impedance element is connected in parallel with the drain-source path of the first field effect transistor.

* * * * *